(12) United States Patent
Kawashima et al.

(10) Patent No.: US 7,121,000 B2
(45) Date of Patent: Oct. 17, 2006

(54) METHOD FOR MANUFACTURING MULTILAYER WIRING BOARD

(75) Inventors: Toshiyuki Kawashima, Ibaraki (JP); Nobuharu Tahara, Ibaraki (JP); Kenichi Ikeda, Ibaraki (JP)

(73) Assignee: Nitto Denko Corporation, Osaka (JP)

( * ) Notice: Subject to any disclaimer, the term of this patent is extended or adjusted under 35 U.S.C. 154(b) by 245 days.

(21) Appl. No.: 10/363,575

(22) PCT Filed: Jun. 28, 2002

(86) PCT No.: PCT/JP02/06537

§ 371 (c)(1),
(2), (4) Date: Feb. 28, 2003

(87) PCT Pub. No.: WO03/005787

PCT Pub. Date: Jan. 16, 2003

(65) Prior Publication Data

US 2004/0031147 A1    Feb. 19, 2004

(30) Foreign Application Priority Data

Jul. 2, 2001    (JP) .............................. 2001-200332

(51) Int. Cl.
*H01K 3/10*    (2006.01)
(52) U.S. Cl. .............................. 29/852; 29/830; 29/831; 29/840; 29/843; 29/846; 156/248; 174/255; 174/262; 428/413
(58) Field of Classification Search .................. 29/852, 29/830, 831, 840, 843, 846; 156/248; 174/255, 174/262; 428/413
See application file for complete search history.

(56) References Cited

U.S. PATENT DOCUMENTS

| | | | |
|---|---|---|---|
| 4,526,835 A * | 7/1985 | Takahashi et al. | ........... 428/413 |
| 5,242,540 A * | 9/1993 | Ishii et al. | ..................... 216/13 |
| 5,346,750 A | 9/1994 | Hatakeyama et al. | |
| 5,520,723 A * | 5/1996 | Jones, Jr. | ..................... 95/161 |
| 6,153,359 A * | 11/2000 | Shimizu et al. | ............. 252/79.1 |
| 6,534,723 B1 * | 3/2003 | Asai et al. | ................. 174/255 |
| 2002/0121334 A1 | 9/2002 | Ikeda et al. | |

FOREIGN PATENT DOCUMENTS

| | | |
|---|---|---|
| CN | 1243416 A | 2/2000 |
| JP | 5-170948 | 7/1993 |
| JP | 05-170948 | 7/1993 |
| JP | 05-299796 | 11/1993 |
| JP | 5-299796 | 11/1993 |
| JP | 6-268345 | 9/1994 |
| JP | 9-324060 | 12/1997 |
| JP | 2001-015872 | 1/2001 |
| JP | 2001-127389 | 5/2001 |

* cited by examiner

*Primary Examiner*—A. Dexter Tugbang
*Assistant Examiner*—Tim Phan
(74) *Attorney, Agent, or Firm*—Knobbe Martens Olson & Bear LLP

(57) ABSTRACT

A method of manufacturing a multilayer wiring board according to the present invention comprises the step of heating and pressurizing a stacked product to be integrated in a state in which a plurality of double-sided wiring boards (10) having a wiring pattern (12) formed on both surfaces of an insulating layer (11) are laminated through a prepreg (1) obtained by impregnating a resin porous film with a thermosetting resin. The present invention is advantageous to mass production because a gap for forming an insulating layer can easily be controlled, and furthermore, can provide thinner layers of the whole board and is also advantageous to the flattening of the surface of the board.

10 Claims, 3 Drawing Sheets

METHOD FOR MANUFACTURING MULTILAYER WIRING BOARD

This application is the U.S. National Phase under 35 U.S.C. §371 of International Application PCT/JP02/06537, filed Jun. 28, 2002, which claims priority to Japanese Patent Application No. 2001-200332, filed Jul. 2, 2001. The International Application was published under PCT Article 21(2) in a language other than English.

TECHNICAL FIELD

The present invention relates to a method of manufacturing a multilayer wiring board comprising the step of laminating and integrating a plurality of double-sided wiring boards by using a prepreg having a resin porous film impregnated with a thermosetting resin, and a multilayer wiring board which can be obtained by the manufacturing method.

BACKGROUND ART

In the steps of forming a core substrate, an insulating layer or the like of a multilayer wiring board to be used in electronic equipment or the like, conventionally, there has been used a prepreg in which a glass fiber fabric or a polymer nonwoven fabric is impregnated with a thermosetting resin and is half cured. The prepreg is thermally pressed together with copper foils provided on both surfaces, for example, so that a double-sided copper foil laminated plate can be obtained, and a wiring pattern is formed on the copper foils and can be thus used as a double-sided wiring board (including a core substrate) for manufacturing a multilayer wiring board.

In recent years, the multilayer wiring board described above has a finer wiring pattern because of the high integration of a wiring, and furthermore, a multilayer structure is achieved and each layer is thinned. As the prepreg described above, therefore, there has been proposed a prepreg using, as a reinforcing phase, a polymer nonwoven fabric in which layers can be thinned and the laser via processing can be carried out more easily.

In a prepreg using a polymeric nonwoven fabric as a reinforcing phase, however, a reduction in the thickness of a layer is limited for reasons of manufacture. Moreover, the irregularities of a fiber are easily generated on a surface and a flat insulating layer is formed with difficulty. For this reason, in a multilayer wiring board in which each layer has a thickness reduced, particularly, there has been employed a method in which a thermosetting resin is applied in place of the lamination of the prepreg or a thermosetting resin sheet is provided to form an insulating layer. In these methods, however, the reinforcing phase is not present. Therefore, it is hard to control a gap for forming the insulating layer. Thus, such a method is not advantageous in respect of mass production.

There has also been known a prepreg using a porous film comprising aromatic polyamide in place of the polymeric nonwoven fabric (Japanese Laid-Open Patent Publication No. 9-324060). Such a prepreg is usually used for manufacturing a double-sided copper foil laminated plate having a copper foil laminated and integrated on both surfaces.

Therefore, it is an object of the present invention to provide a method of manufacturing a multilayer wiring board which is advantage to mass production because gap control for forming an insulating layer is carried out easily, and furthermore, can provide thinner layers of the whole board and is advantageous to the flattening of the surface of the board, and a multilayer wiring board which can be obtained by the manufacturing method.

DISCLOSURE OF THE INVENTION

The object can be achieved by the present invention as will be described below.

More specifically, the present invention provides a method of manufacturing a multilayer wiring board comprising the step of heating and pressurizing a stacked product to be integratd in a state in which a plurality of double-sided wiring boards having a wiring pattern formed on both surfaces of an insulating layer are laminated through a prepreg obtained by impregnating a resin porous film with a thermosetting resin.

According to the method of manufacturing a multilayer wiring board in accordance with the present invention, the stacked product is heated and pressurized to be integrated in a state that a plurality of double-sided wiring boards laminated through a prepreg having a resin porous film impregnated with a thermosetting resin. As compared with the case in which the prepreg including a polymeric nonwoven fabric is used, therefore, the resin porous film is deformed so that a flat insulating layer can be formed. In addition, the thickness of the layer can be reduced. Moreover, since the resin porous film has the function on a space basis, the gap control of the insulating layer can easily be carried out by pressurizing force. Thus, it is possible to provide a manufacturing method which is advantageous to mass production.

In the foregoing, it is preferable that the insulating layer of the double-sided wiring board should have a resin porous film impregnated with a thermosetting resin. In this case, the insulating layer of the double-sided wiring board can also be thinned and the thickness of the whole board can be more reduced.

Furthermore, it is preferable that the method should further comprise the step of forming a via hole penetrating through the wiring patterns of a plurality of layers on the stacked product integrated and then plating at least the inside of the via hole with a metal. In this case, the wiring patterns of the layers can be conductively connected by the plating in the via hole.

On the other hand, the multilayer wiring board according to the present invention can be manufactured by the manufacturing method described above. The multilayer wiring board in accordance with the present invention has a lamination structure in which a lamination is carried out through the prepreg having the functions and effects described above. Therefore, the layers of the whole board can be thinned and the degree of flattening of the surface of the board can be enhanced, which is advantageous to a poststep such as mounting of electronic components. In addition, the gap control for forming an insulating layer can easily be carried out. Therefore, it is possible to obtain a multilayer wiring board which is advantageous to mass production.

BEST MODE FOR CARRYING OUT THE INVENTION

Figure 1A:
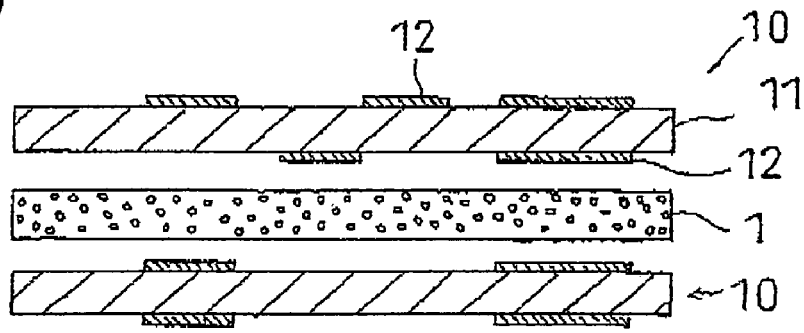
FIGS. 1(a)–1(d) are process drawings according to a first embodiment of a method of manufacturing a multilayer wiring board in accordance with the present invention.

The best mode for carrying out the present invention will be described below in order of first to third embodiments and a prepreg with reference to the drawings.

FIRST EMBODIMENT

A method of manufacturing a multilayer wiring board according to the present invention comprises the step of heating and pressurizing a stacked product to be integrated in a state in which a plurality of double-sided wiring boards 10 having a wiring pattern 12 formed on both surfaces of an insulating layer 11 are laminated through a prepreg 1 having a resin porous film impregnated with a thermo setting resin as shown in FIGS. 1(a)–1(d). The prepreg 1 will be described below in detail.

The insulating layer 11 of the double-sided wiring board 10 according to the present invention may be a heat-resistant resin having no reinforcing phase or a polymeric nonwoven fabric to be the reinforcing phase. It is preferable that the same layer as the prepreg 1 using the resin porous film as the reinforcing phase is utilized. In the case in which the insulating layer 11 contains a thermosetting resin, both a half cured product and a cured product may be used. In the case in which the wiring pattern 12 formed on the insulating layer 11 is convex-shaped, the present invention is particularly advantageous to the flattening of the whole board. It is also possible to use the double-sided wiring board 10 having a flat surface in which the wiring pattern 12 is buried in the insulating layer 11.

It is preferable that the wiring pattern 12 should be formed by pattern etching a metal foil bonded to both surfaces by using an etchant, for example, pattern plating or the like. For the etching, an etchant corresponding to the type of the metal is used. A dry film resist or the like can be used for the pattern etching or the like. Examples of the metal forming the wiring pattern 12 include copper, cupro-nickel, bronze, brass, aluminum, nickel, iron, stainless, gold, silver, platinum and the like, and the copper is preferred. It is preferable that the wiring pattern 12 should have a thickness of 1 to 35 μm in order to reduce the thickness of the layer of the whole board. In order to enhance the adhesion to the prepreg 1, the surface of the wiring pattern 12 may be subjected to various physical or chemical surfacing processes such as a rough surfacing process, a blacking process and the like.

In the first embodiment, FIG. 1(a) shows an example in which two double-sided wiring boards 10 and one prepreg 1 are laminated at a time. It is sufficient that the prepreg 1 having a releasing resin film laminated on both surfaces thereof is prepared and the resin film is separated for use, for example. The laminated layer may be simply provided by stacking or may be bonded to any of the upper and lower double-sided wiring boards 10 by pressure with the use of the adhesive force of the prepreg 1.

Figure 1B:
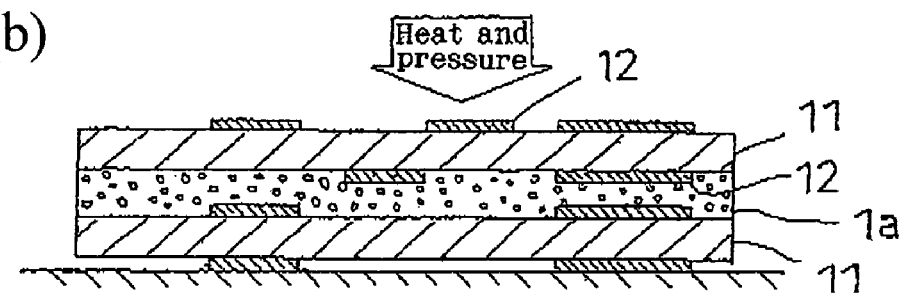

As shown in FIG. 1(b), next, the laminated product is heated and pressurized to be integrated. Various pressers such as a vacuum presser, a heat presser, a continuous presser and the like can be utilized for the heating and pressurization. Moreover, any of the conventional known conditions can be applied to the temperature and pressure of thermal pressing. In the present invention, the temperature and the pressure can be properly set depending on the type of the thermosetting resin impregnated in the prepreg 1. For example, a temperature of 100 to 200° C. and a pressure of 0.5 to 5 MPa are preferable.

There is obtained a lamination structure in which lamination and integration are carried out with the wiring pattern 12 on the insulating layer 11 buried in a composite insulating layer 1a (the cured prepreg 1) obtained by curing the thermosetting resin impregnating the porous film. The multilayer wiring board according to the present invention has such a lamination structure.

Figure 1C:
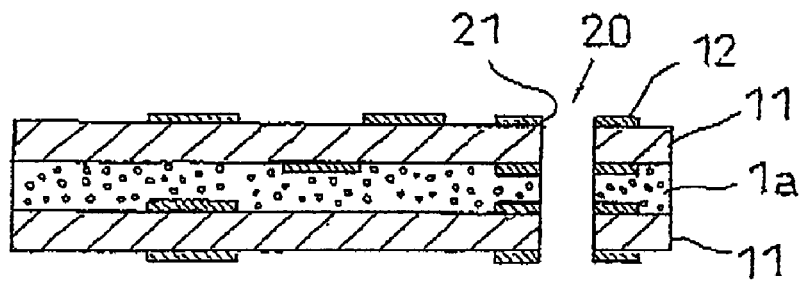

As shown in FIG. 1(c), next, a via hole 20 penetrating through the wiring patterns 12 of a plurality of layers is formed on the integrated and laminated product. While the via hole 20 penetrating through all the layers is formed in the example shown in the drawing, it does not need to penetrate through all the layers.

It is preferable that the wiring pattern 12 in a portion forming the via hole 20 should constitute a pattern portion (land) having a great line width or diameter. Examples of a method of opening the via hole 20 include drilling, a punch, laser processing using various lasers such as a YAG laser, and the like.

Figure 1D:
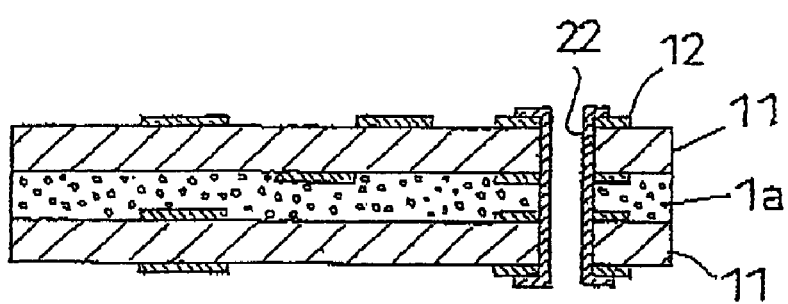

As shown in FIG. 1(d), next, at least the inside of the via hole 20 is plated with a metal. Consequently, a plated layer 22 for conductively connecting the wiring patterns 12 between the layers is formed. The metal plating is usually carried out by using copper. For example, surface activation, non-electrolytic copper plating, electrolytic copper plating and the like are carried out in order. As in the example of the drawing, in the case in which only the inside of the via hole 20 and the vicinity of an opening 21 are plated, a non-plated portion is covered with a plating resist (not shown). A dry film resist or the like is used for the plating resist, and the plated resist is formed such that only a resist portion remains by desired exposure and development. All of conventional known methods can be used for the method of plating the inside of the via hole 20.

SECOND EMBODIMENT

In a second embodiment, FIGS. 2(a)–2(d) show an example in which a prepreg 1 is previously bonded temporarily to any double-sided wiring board 10. In some cases in which the prepreg 1 is previously bonded temporarily, a whole manufacturing process can be simplified. Different portions from the first embodiment will be described below.

Figure 2A:
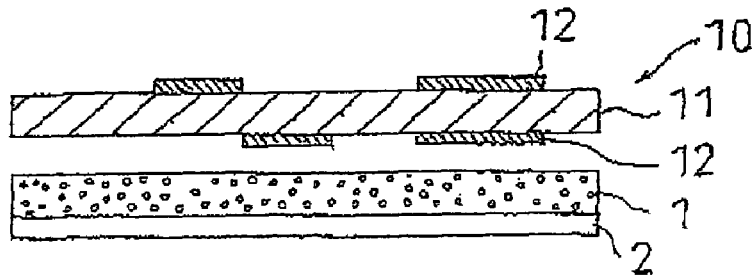
FIGS. 2(a)–2(d) are process drawings according to a second embodiment of the method of manufacturing a multilayer wiring board in accordance with the present invention.
Figure 2B:
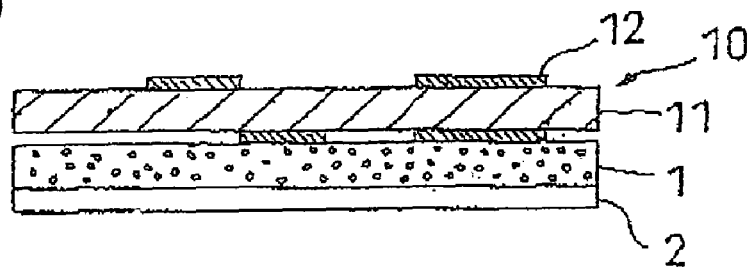

First of all, as shown in FIGS. 2(a) and 2(b), the prepreg 1 having a releasing resin film 2 attached thereto is temporarily bonded to one of wiring patterns 12 of the double-sided wiring board 10. The temporary bonding can be carried out at a comparatively low temperature and low pressure (for example, a temperature of 100° C. or less and a pressure of 0.1 to 1 MPa) such that only the resin film 2 can be separated easily.

Figure 2C:
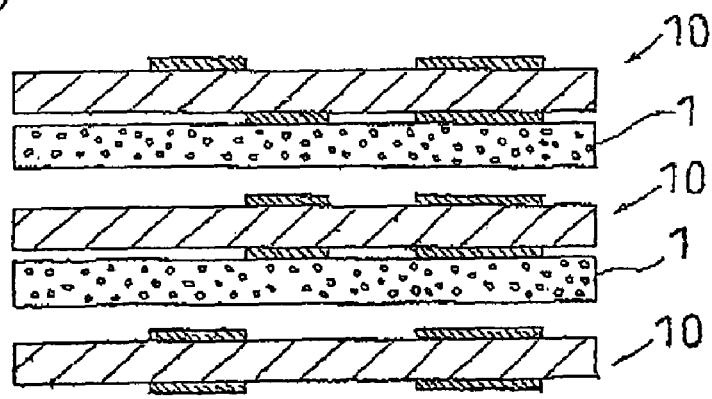
Figure 2D:
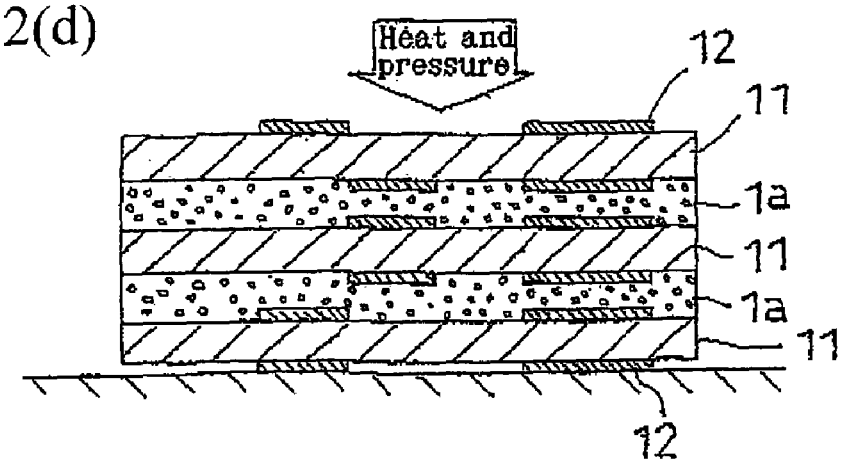

Next, a plurality of prepregs 1 from which the film 2 is separated after the temporarily bonding and the double-sided wiring board 10 to which the prepreg 1 is not temporarily bonded are laminated as shown in FIG. 2(c). The laminated product is heated and pressurized to be integrated as shown in FIG. 2(d) in the same manner as in the first embodiment. The conductive connection of the layers can also be carried out in the same manner as in the first embodiment.

THIRD EMBODIMENT

Figure 3A:
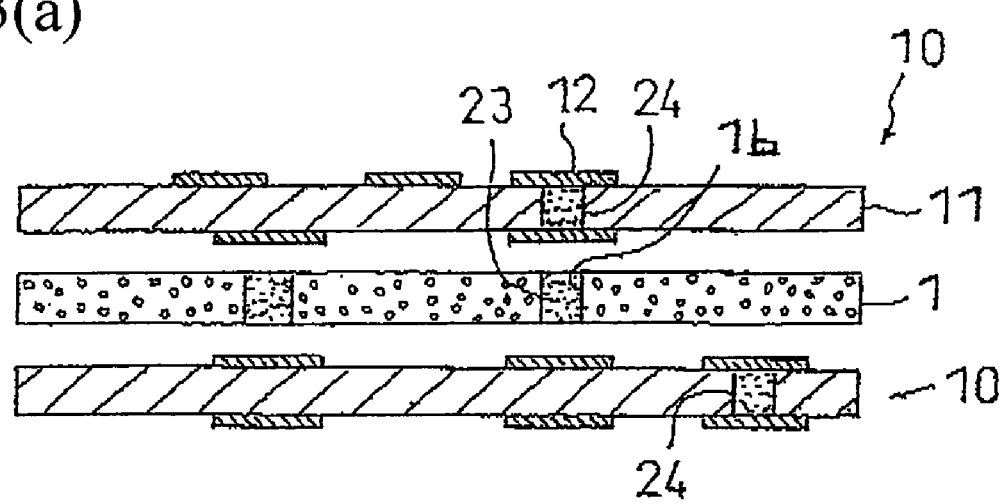
FIGS. 3(a)–3(b) are process drawings according to a third embodiment of the method of manufacturing a multilayer wiring board in accordance with the present invention.
Figure 3B:
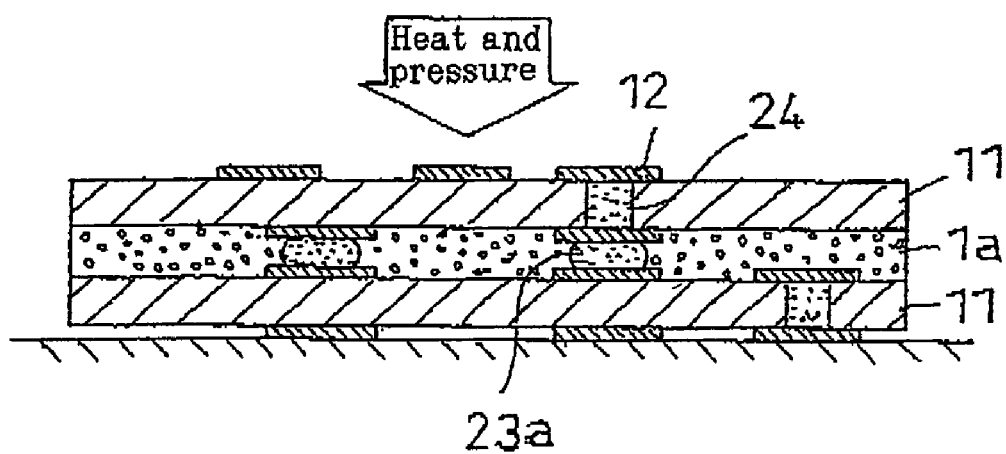

In a third embodiment, there is shown an example in which the conductive connection structure between the layers is not formed after lamination and integration but a conductive paste 23 is previously filled in a through hole 1b of a prepreg 1 and the conductive connection structure is formed simultaneously with the lamination and integration of a double-sided wiring board 10 as shown in FIGS. 3(a)–3(b). Different portions from the first embodiment will be described below.

In the present embodiment, as shown in FIG. 3(a), there are used the prepreg 1 having the conductive paste 23 filled in the previously formed through hole 1b and the double-sided wiring board 10 having a conductive connection structure 24 previously formed.

Examples of a method of forming the through hole 1b on the prepreg 1 include drilling, a punch and laser processing using various lasers such as a YAG laser. In order to increase the density of a wiring board, it is preferable that the laser processing should be carried out. As the conductive paste 23, a conductive filler formed of particulates such as silver, copper, carbon or solder is dispersed in a binder resin or a solvent. A thermosetting resin is suitably used as a binder resin, and it is preferable to use the binder resin in which a curing reaction progresses by heating and pressurization which will be described below.

For filling the conductive paste 23, it is possible to use a method, for example, printing such as screen printing, offset printing, pad printing, ink jet printing or bubble jet printing, and filling using squeeze. In general, the mean size of the particulates of the conductive paste 23 is 0.05 to 10 μm. By using a porous film having a smaller hole diameter than the mean particle size for the prepreg 1, consequently, the diffusion of the particulates to the outside of the through hole 1b can be prevented to form an interlayer connection having a high reliability by compression.

On the other hand, examples of a method of forming the conductive connection structure 24 in the double-sided wiring board 10 include a method of filling a conductive paste in a via hole in the same manner as described above and a method of plating the inside of the via hole.

In the present embodiment, particularly, it is necessary to carry out alignment with high precision when laminating a plurality of double-sided wiring boards 10 and the prepreg 1. For example, it is possible to easily align the stacked product by using a guide hole, a guide pin and the like.

As shown in FIG. 3(b), next, the laminated product is heated and pressurized to be integrated in the same manner as in the first embodiment. At this time, in the case in which a wiring pattern 12 formed on an insulating layer 11 is convex-shaped, the conductive paste 23 is compressed by a double of the thickness of the wiring pattern 12. Also in the case in which the particulates of the conductive paste 23 are diffused to the outside to some extent, accordingly, an interlayer connection having a high reliability can be carried out.

(Prepreg)

The prepreg according to the present invention is obtained by impregnating a resin porous film with a thermosetting resin. A resin having an excellent heat resistance and a high mechanical strength is preferable for the material of the porous layer to be used in the present invention, and it is possible to employ various resins such as polyimide, polyester, polyamide, particularly, aromatic polyamide, polyamideimide, polyetherimide and polyether sulfone. Above all, a polyimide based resin is preferable because of an excellent insulating property and heat resistance and an excellent adhesion with a metal layer. The aromatic polyamide is also preferable because of an excellent insulating property and heat resistance and a lower coefficient of thermal linear expansion.

Examples of the method of forming a porous film include a wet coagulation process, a dry coagulation process and a drawing process. In order to obtain a sponge structure, the wet coagulation process is preferable. In the wet coagulation process, generally, a film forming solution (dope) having a resin and an additive dissolved in a solvent is prepared and is applied (cast) to a film forming base material, and is then immersed in a coagulating solution to carry out solvent substitution. Consequently, the resin is coagulated (changed into a gel) and the coagulating solution is then dried and removed. Thus, the porous film is obtained.

The polyamide based resin mainly including a repetition unit in which an acid residue and an amine residue are imides bonded may contain other copolymerized components and blended compounds. In respect of a heat resistance, a hydroscopic property and a mechanical strength, polyimide having an aromatic group as a main chain, for example, polyimide composed of a polymerized product containing a tetracarboxylic acid component and an aromatic diamine component can be employed. In particular, it is desirable that a polymer having a limiting viscosity of 0.55 to 3.00, preferably, 0.60 to 0.85 (a measured value at 30° C.) can be used. In the case in which a porous film is to be formed by the wet coagulation process, the polymer having the limiting viscosity within the above range can be formed into a porous film having an excellent dissolving property in a solvent, a great mechanical strength and independence.

Referring to the polyamide based resin, a polymer or a precursor thereof (polyamide acid) can be used for film formation. The polyamide acid has an advantage that a molecular structure is less restricted because it has a more excellent dissolving property as compared with polyimide. While the polymer may be completely changed into imide, 70% or more of a change rate to imide is permitted. In the case in which a polymer having a comparatively high change rate to imide is used for doping, it is preferable to use a polymer including, in a repetition unit, a component having a high flexibility such as butanetetradicarboxylic anhydride.

Any solvent for dissolving the polyimide based resin or the precursor thereof can be used. It is preferable to use an aprotic polar solvent such as N-methyl-2-pyrrolidone, N,N-dimethylacetamide, N,N-dimethylformamide or dimethylsulfoxide in respect of a dissolving property and a solvent substitution speed for a coagulating solvent in the case in which a porous film is formed by the wet coagulation process. Preferable examples include N-methyl-2-pyrrolidone. Moreover, a solvent such as diethylene glycol, dimethyl ether or diethyleneglycol diethylether may be mixed to regulate the speed of a solvent substitution in the wet coagulation process.

On the other hand, the aromatic polyamide includes so-called para type aramid and metha type aramid, and those in which a part of their main chain is substituted by diphenyl ether, diphenyl propane, diphenyl methane, diphenyl ketone, diphenyl sulfoxide or those in which biphenyl or a hydrogen group of an aromatic ring is substituted by a methyl group, a halogen atom or the like.

Examples of the para type aramid include poly p-phenyleneterephthalamide. The aramid thus constituted by only a rigid component is to be dissolved in a special reagent. For the aromatic polyamide used for the porous film, accordingly, it is preferable to at least partially use aramid having a part of main chain substituted by a component having a flexibility or the metha type aramid.

Examples of the component giving a flexibility include m-phenylene, 2,7-naphthalene, diphenyl ether, 2,2-diphenyl propane and diphenyl methane. Such components are used as a dicarboxylic monomer or a diamine monomer for copolymerization and is thus introduced into a bone structure. The component having a higher copolymerization ratio generally has a more excellent dissolving property for a solvent.

Examples of the solvent for dissolving the aromatic polyamide include tetramethyl urea, hexamethyl phospholamide, N,N-dimethyl acetamide, N-methyl-2-pyrrolidone, N-methylpiperidone-2, N,N-dimethylethylene urea, N,N,N', N'-tetramethyl allonic amide, N-methyl caprolactam, N-acethyl pyrrolidine, N,N-diethyl acetamide, N-ethyl pyrrolidone-2, N,N-dimethyl propionic amide, N,N-dimethyl isobutyl amide, N-methyl formamide, N,N-dimethyl propylene urea and their mixed systems. Furthermore, it is preferable to use an aprotic polar solvent such as N-methyl-2-pyrrolidone, N,N-dimethyl acetamide or N,N-dimethyl formamide in respect of a dissolving property and a solvent substitution speed for a coagulating solvent. More preferable examples include N-methyl-2-pyrrolidone.

Moreover, a solvent such as diethyleneglycol dimethy ether or diethyleneglycol diethyl ether or diethyleneglycol dibutyl ether may be mixed to regulate the speed of a solvent substitution.

Preferably, the doping in the wet coagulation process is carried out by application at a temperature of −20 to 40° C. Moreover, it is possible to use any coagulating solution which does not dissolve a resin to be used and has a compatibility with the solvent. For the coagulating solution, water, alcohols such as methanol, ethanol and isopropyl alcohol and their mixed solution can be used, particularly, the water can be used suitably. The temperature of the coagulating solution at time of immersion is not particularly restricted but a temperature of 0 to 90° C. is preferable.

The polymer concentration of a film forming solution preferably ranges from 5% by weight to 25% by weight, more preferably, 7% by weight to 20% by weight. If the concentration is too high, a viscosity is excessively increased and handling is hard to perform. If the concentration is too low, a porous film tends to be formed with difficulty.

In order to regulate a pore shape and a pore size, an inorganic material such as lithium nitrate or an organic material such as polyvinyl pyrrolidone can also be added. It is preferable that the concentration of an additive should be 1% by weight to 10% by weight in a solution. If the lithium nitrate is added, the substitution speed of a solvent and a coagulating solution is increased and a finger void structure (a structure having a finger-like void) is formed in a sponge structure. When an additive for reducing a coagulation speed such as polyvinyl pyrrolidone is added, it is possible to obtain a porous film having a sponge structure expanded uniformly.

The dope is applied to have a constant thickness and is immersed in a coagulating solution such as water and is thus coagulated or is left in a water vapor atmosphere and is thus coagulated and is then immersed in the water. Thus, the solvent is removed so that a porous film is formed. After the porous film is formed, it is taken out of the coagulating solution and is then dried. A drying temperature is not particularly limited but is desirably 200° C. or less.

In the case in which a porous film of a polyimide based resin is formed using a precursor thereof (polyamide acid), heat treatment is finally carried out at 200 to 500° C. and the precursor (polyamide acid) is heated and ring-closed to form polyimide.

Referring to the porous film in the present invention, a back face or surface thereof preferably has a mean pore size of 0.05 μm or more, and more preferably, 0.1 to 5 μm in order to impregnate the porous film with a bonding layer. In order to suitably show the function of a reinforcing layer, the vacancy rate of the porous film is preferably 30 to 98%, and more preferably, 40 to 70%.

While the thickness of the porous film is not particularly restricted, desolvation tends to take a long time if the thickness is too great. Moreover, there has recently been desired a multilayer wiring board which is thin and light and has a great mechanical strength. Therefore, the thickness is preferably 5 to 100 μm.

In the present invention, the prepreg having a resin porous film impregnated with a thermosetting resin is used and can be obtained by impregnating the hole of the porous film with the raw material composition of the thermosetting resin.

While a method of directly applying the raw material solution of a thermosetting resin to the surface of a porous film by various coaters or the like may be used for a method of impregnating the raw material composition, it is preferable to use a method of laminating a solid coated film obtained by applying a raw material solution to the surface of a base material sheet and drying them on the surface of a porous film and carrying out impregnation by heating and pressurization. According to this method, also in the case where the prepreg is thin, aromatic polyamide can be prevented from being swollen with the deformation of the porous film by a solvent contained in the raw material solution of the thermosetting resin.

Examples of the thermosetting resin include en epoxy resin, a phenol resin, a polyimide resin, polyamide acid and the like. The epoxy resin, a mixture of the epoxy resin and other resins and the like are preferred in respect of a price and easy handling. The raw material solution of the thermosetting resin may contain a catalyst, a curing agent, a flame retardant, a filler, a plasticizer, an accelerator and the like in addition to a solvent. Examples of the solvent contained in the raw material solution of the thermosetting resin include ketones, acetic esters, ethers, aromatic hydrocarbons, alcohols and the like depending on the type of the thermosetting resin.

For the base material sheet, a resin, a metal and the like can be used and a resin film is preferred. In both direct coating and indirect impregnation, examples of a coating method include coating methods using a blade coater, a comma coater, a roll coater, a calendar coater and a bar coater. If a coating thickness is uniform, the thickness of the solid coated film is also even so that the amount of impregnation can become equal.

In the drying of the solvent, it is not necessary to completely remove the solvent and non-fluidization is enough. For a drying method, drying with heat or hot-air drying is preferred in respect of efficiency. Such a temperature as not to excessively progress the curing reaction of a thermosetting resin is selected for a heating temperature.

Examples of a method of carrying out heating and pressurization include a method using various heat pressers and heat laminators and devices having an evacuator attached to the heat pressers or the heat laminators. In the present invention, it is preferable that the heat laminator should be used. By heating and pressurization, it is possible to manufacture a prepreg obtained by impregnating a porous film with the half cured substance of a thermosetting resin (which is not cured completely).

The thickness of the prepreg according to the present invention is preferably 5 to 150 μm, and more preferably 5 to 75 μm in order to thin the layers of the whole board while maintaining the function of the prepreg. Also in the case in which the insulating layer of the double-sided wiring board is formed by the prepreg, moreover, it is preferable that a thickness should be set within the same range.

INDUSTRIAL APPLICABILITY

The method of manufacturing a multilayer wiring board according to the present invention is advantageous to mass production because a gap for forming an insulating layer can easily be controlled, and furthermore, can provide thinner layers of the whole board and is thus advantageous to the flattening of the surface of the board.

What is claimed is:

1. A method of manufacturing a multilayer wiring board comprising the steps of:
   providing a prepreg comprising a resin porous film made of polyimide resin impregnated with a thermosetting resin wherein the resin porous film is structured by wet coagulation and does not include a polymeric nonwoven fabric;
   providing double-sided wiring boards each comprising an insulating layer and a wiring pattern formed on both surfaces of the insulating layer;
   heating and pressurizing a stacked product to be integrated constituted by the prepreg interposed between the double-sided wiring boards; and
   controlling the gap between the wiring boards using a pressurizing force to deform the resin porous film and form a flat insulating layer,
   wherein a flat insulating layer is formed with reduced difficulty as compared to a method in which a polymeric nonwoven fabric is used.

2. The method of manufacturing a multilayer wiring board according to claim 1, wherein the insulating layer of the double-sided wiring board is obtained by impregnating a resin porous film with a thermo setting resin.

3. The method of manufacturing a multilayer wiring board according to claim 2, farther comprising the steps of forming a via hole penetrating through the wiring patterns of a plurality of layers on the stacked product integrated and then plating at least an inside of the via hole with a metal.

4. The multilayer wiring board which is manufactured by the manufacturing method according to claim 3.

5. The multilayer wiring board which is manufactured by the manufacturing method according to claim 2.

6. The method of manufacturing a multilayer wiring board according to claim 1, further comprising the steps of forming a via hole penetrating through the wiring patterns of a plurality of layers on the stacked product integrated and then plating at least an inside of the via hole with a metal.

7. The multilayer wiring board which is manufactured by the manufacturing method according to claim 6.

8. A multilayer wiring board which can be manufactured by the manufacturing method according to claim 1.

9. The method of manufacturing a multilayer wiring board according to claim 1, wherein the resin porous film has a pore size of 0.1 to 5 μm, a vacancy rate of 30 to 98%, and a thickness of 5 to 100 μm.

10. The method of claim 1, wherein the step of providing a prepreg further comprises:
    preparing a resin porous film made of polyimide resin by wet coagulation wherein a film forming solution having a resin and an additive dissolved in a solvent is applied to a base, immersed in a coagulation solution, and dried; and
    preparing the prepreg by impregnating the resin porous film with a thermo setting resin.

* * * * *